United States Patent

Yako et al.

Patent Number: 5,985,511
Date of Patent: *Nov. 16, 1999

[54] PHOTORESIST COMPOSITION

[75] Inventors: Yuko Yako, Takatsuki; Naoki Takeyama, Settu; Kenji Takahashi, Takarazuka, all of Japan

[73] Assignee: Sumitomo Chemical Company, Limited, Osaka, Japan

[*] Notice: This patent is subject to a terminal disclaimer.

[21] Appl. No.: 08/764,126

[22] Filed: Dec. 12, 1996

[30] Foreign Application Priority Data

Dec. 15, 1995 [JP] Japan .................................. 7-327002

[51] Int. Cl.$^6$ ....................................... G03F 7/004
[52] U.S. Cl. ................. 430/270.1; 430/920; 430/924
[58] Field of Search ............................. 430/270.1, 920, 430/924

[56] References Cited

U.S. PATENT DOCUMENTS

| | | | |
|---|---|---|---|
| 5,120,629 | 6/1992 | Bauer et al. | 430/270.1 |
| 5,272,042 | 12/1993 | Allen et al. | 430/920 |
| 5,320,931 | 6/1994 | Umehara et al. | 430/270.1 |
| 5,492,793 | 2/1996 | Breyta et al. | 430/920 |
| 5,585,218 | 12/1996 | Nakano et al. | 430/270.1 |
| 5,593,812 | 1/1997 | Babich et al. | 430/270.1 |
| 5,707,776 | 1/1998 | Kawabe et al. | 430/270.1 |
| 5,846,688 | 12/1998 | Fukui et al. | 430/270.1 |

FOREIGN PATENT DOCUMENTS

| | | |
|---|---|---|
| 0451741 | 10/1991 | European Pat. Off. . |
| 0589451A2 | 3/1994 | European Pat. Off. . |
| 0607899 | 7/1994 | European Pat. Off. . |
| 0632327 | 1/1995 | European Pat. Off. . |
| 0689098 | 12/1995 | European Pat. Off. . |
| 0742488 | 11/1996 | European Pat. Off. . |
| 06214392 | 1/1993 | Japan . |
| 6266110 | 9/1994 | Japan . |
| 6266111 | 9/1994 | Japan . |
| 792678 | 4/1995 | Japan . |
| 7120929 | 5/1995 | Japan . |
| 7134419 | 5/1995 | Japan . |
| 9410608 | 5/1994 | WIPO . |

*Primary Examiner*—John S. Chu
*Attorney, Agent, or Firm*—Birch, Stewart, Kolasch & Birch, L.L.P.

[57] ABSTRACT

A positive photoresist composition having excellent various performances (e.g. resolution, resistance to time delay effect, profile), small PEB dependence as well as excellent sensitivity, film retention and coatability, which comprises a polyvinylphenol resin whose phenolic hydroxyl group is partially protected; a sulfonate of a N-hydroxyimide compound as an acid generator; an amine compound; and an electron donor having a redox potential of not more than 1.7 eV is provided.

10 Claims, No Drawings

PHOTORESIST COMPOSITION

FIELD OF THE INVENTION

The present invention relates to a photoresist composition suitable for lithography which uses far ultraviolet light (including excimer laser, etc.), electron beam, X-ray or Radiation.

BACKGROUND OF THE INVENTION

With high integration of integrated circuits in recent years, formation of a pattern of a submicron order has been required. Excimer laser lithography has attracted special interest because it makes it possible to produce 64 MDRAM (mega-bit Dynamic RAM) and 256 MDRAM. Heretofore, near ultraviolet light has been mainly used for lithography. However, with the change of light source, the following performances have become required of the resist, in addition to various performances (e.g. heat resistance, film retention, profile, etc.) which have hitherto been required.
(a) The resist shall have high sensitivity to the above light source.
(b) The resist shall have high resolution.

Under these circumstances, a so-called chemical amplification type resist utilizing acid catalyst and chemical amplification effects has been suggested. The chemical amplification type resist develops a solubility of the exposed part to a developing solution by the reaction using an acid as a catalyst generated from an acid generator due to light irradiation, thereby obtaining a positive photoresist.

As the chemical amplification positive resist, a polyvinylphenol resin wherein the phenolic hydroxyl group is protected with a group which is eliminated by an action of the acid is often used. However, the resist using such a resin had a problem that it is liable to be influenced by the environment. It is well known that, in the process of proceeding the elimination reaction of a protective group due to a heat treatment after exposure (Post Exposure Bake, hereinafter sometimes referred to as "PEB"), the sensitivity changes with the temperature at the time of PEB and the performances change with the standing time before the heat treatment. The former is referred to as a "PEB dependence" and the latter is referred to as a "time delay effect". The time delay effect lowers the resolution and forms a layer insoluble to the developing solution on the surface of a resist film to form a T-shaped pattern after developing, which results in deterioration of the size reproducibility.

In order to prevent such a time delay effect, it is known to add a nitrogen-containing compound such as N-methyl-2-pyrrolidone to the chemical amplification type positive resist. However, even if N-methyl-2-pyrrolidone is added, it is not enough to prevent the time delay effect and the resolution is not sufficiently improved. Furthermore, the sensitivity of the resist is lowered due to the presence of the nitrogen-containing compound. Therefore, further improvement has been desired.

Under these circumstances, the present inventors have intensively studied so as to accomplish the following object.

OBJECT OF THE PRESENT INVENTION

An object of the present invention is to provide a positive photoresist composition excellent in various performances (such as resolution, resistance to time delay effect and profile), having small PFB dependence as well as being excellent in sensitivity, film retention and coatability.

This object as well as other objects and advantages of the present invention will become apparent to those skilled in the art from the following description.

SUMMARY OF THE INVENTION

The present invention provides a positive photoresist composition comprising:
(A) a polyvinylphenol resin whose phenolic hydroxyl group is partially protected;
(B) a sulfonate of a N-hydroxyimide compound as an acid generator;
(C) an amine compound; and
(D) an electron donor having a redox potential of not more than 1.7 eV.

DETAILED DESCRIPTION OF THE INVENTION

In the present invention, a polyvinylphenol resin whose phenolic hydroxyl group is partially protected is used. The term "polyvinylphenol resin" used herein means a compound wherein a hydroxyl group and a vinyl group are bonded to the benzene ring, i.e., polymer comprising vinylphenol as a constituent monomer. Specific examples of "polyvinylphenol resin" include a homopolymer of vinylphenol, a copolymer of vinylphenol and another vinyl compound, partially hydrogenated polymer thereof and the polymer whose phenolic hydroxyl group is partially alkyletherified. The position of the hydroxyl group and vinyl group on vinylphenol is not specifically limited, but p-vinylphenol is generally preferred.

When using a partially hydrogenated polyvinylphenol resin, the proportion of double bonds of the benzene ring saturated by hydrogenation (hydrogenation degree) is generally not more than 0.5, preferably not more than 0.15.

When using a polyvinylphenol resin wherein the phenolic hydroxyl group is partially alkyl-etherified, an alkyl having 1 to 4 carbonatoms is preferred as the alkyl. When the number of carbon atoms is not less than 3, it may be a straight-chain or branched alkyl. It is particularly preferred that the alkyl is methyl or ethyl. When the hydroxyl group of polyvinylphenol which is not hydrogenated is partially alkyl-etherified, the a proportion of alkyl-etherified hydroxyl groups (etherification degree) is preferably within the range from 0.001 to 0.35, particularly from 0.01 to 0.22. When the hydroxyl group of the partially hydrogenated polyvinylphenol is partially alkyl-etherified, the etherification degree is preferably within the range from 0.001 to 0.3, particularly from 0.01 to 0.2. The partial alkyl etherification can be conducted, for example, by reacting polyvinylphenol or partially hydrogenated polyvinylphenol with an alkyl halide under the basic condition according to the method described in N. Rabjohn et al., "Organic Syntheses Collective Volume 4", pp. 836–839, John Wiley & Sons (1963).

Regarding the polyvinylphenol resin used in the present invention, a part of the phenolic hydroxyl group is partially protected. Examples of the protective group of the phenolic hydroxyl group include the 2-residue of a heterocycle comprising oxygen as one ring atom, preferably a saturated heterocycle, such as tetrahydropyran-2-yl and tetrahydro-2-furyl; and 1-alkoxyalkyl, alkoxycarbonyl and alkoxycarbonylalkyl such as methoxyethyl and 1-ethoxyethyl. Among them, tert-butoxycarbonylmethyl is particularly preferred. For introducing such a protective group into the phenolic hydroxyl group, a conventional protective group introduction reaction can be used. For example, when the alkoxycarbonylalkyl is used as the protective group, a part of the phenolic hydroxyl group can be alkoxycarbonylalkyl-etherified by reacting the polyvinylphenol resin with an alkyl halogenoalkanoate under basic conditions. The proportion of the hydroxyl groups substituted with the protective group (protective group introduction rate) in the polyvinylphenol resin is preferably within the range from 0.01 to 0.4.

Regarding the polyvinylphenol resin whose phenolic hydroxyl group is partially protected, the weight-average molecular weight (in polystyrene terms) determined by gel permeation chromatography (GPC) is preferably within the range from 3,000 to 35,000. The weight-average molecular weight is more preferably from 5,000 to 32,000, further more preferably from 5,000 to 25,000, particularly preferably from 5,000 to 20,000. The polymerization degree of the polyvinylphenol resin does not change by the protective group introduction reaction and, therefore, the weight-average molecular weight after partial introduction of the protective group can be adjusted within the above range by using the polyvinylphenol resin having a little lower weight-average molecular weight within the above range, e.g. within the range from 3,000 to 30,000.

The polyvinylphenol resins wherein the phenolic hydroxyl group of the polyvinylphenol resin is partially protected can be used alone or in combination of two or more kinds thereof in the photoresist composition of the present invention. Furthermore, other alkaline-soluble resins can be mixed with the polyvinylphenol resin so long as the effect of the present invention is not adversely affected. Examples of the other resin mixed with the polyvinylphenol resin include a polyvinylphenol, partially alkyl-etherified polyvinylphenol, polyisopropenylphenol resin, copolymers of vinylphenol and styrene (preferably those wherein the proportion of vinylphenol is not less than 50% by mol), copolymers of isopropenylphenol and styrene (preferably those wherein the proportion of isopropenylphenol is not less than 50% by mol), partially hydrogenated polyvinylphenol and partially alkyl-etherified and partially hydrogenated polyvinylphenol. It is also possible to mix these resins with a resin having tert-butoxycarbonylmethyl or the other protective group which is eliminated due to the action of the acid.

The photoresist composition of the present invention comprises a sulfonate of a N-hydroxyimide compound as the acid generator.

Examples of the sulfonate of the N-hydroxyimide compound include those represented by the general formula (I):

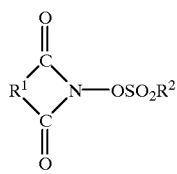

(I)

wherein $R^1$ represents an arylene, an optionally substituted alkylene or an optionally substituted alkenylene; and $R^2$ represents an alkyl which may be substituted with a substituent other than fluorine, or an aryl containing no fluorine.

In the general formula (I), the arylene represented by $R^1$ can be phenylene, naphthylene and the like, and the naphthylene and phenylene may be substituted. Examples of the substituent of the phenylene and naphthylene include alkyl having 1 to 4 carbon atoms, alkoxy having 1 to 4 carbon atoms, halogen (e.g. fluorine, chlorine, bromine, iodine), nitro and acetylamino. As the phenylene, 1,2-phenylene is preferred. As the naphthylene, 1,2-, 2,3- or 1,8-naphthylene is preferred.

The alkylene represented by $R^1$ can be those having 1 to 6 carbon atoms, and may be substituted. The alkylene having 3 or more carbon atoms may be a straight-chain or branched alkylene. Examples of the preferred alkylene include 1,2-ethylene, 1,1-ethylene, propylene, trimethylene and the like. Examples of the substituent of the alkylene include halogen (e.g. fluorine, chlorine, bromine, iodine), alkoxy having 1 to 4 carbon atoms, non-substituted phenyl and phenyl substituted with a substituent such as alkyl having 1 to 4 carbon atoms, alkoxy having 1 to 4 carbon atoms, halogen, nitro or acetylamino.

The alkenylene represented by $R^1$ can be those having 2 to 4 carbon atoms, and may be substituted. The alkenylene may be straight-chain or branched alkenylene. Preferred alkenylene is vinylene. Examples of the substituent of the alkenylene include non-substituted phenyl and phenyl substituted with a substituent such as alkyl having 1 to 4 carbon atoms, alkoxy having 1 to 4 carbon atoms, halogen, nitro or acetylamino.

The alkyl represented by $R^2$ in the general formula (I) can be those having 1 to 12 carbon atoms, and may be substituted. The alkyl having 3 or more carbon atoms may be a straight-chain, branched or cyclic alkyl, preferably straight-chain alkyl or alkyl having a cyclic moiety which may be a crosslinked ring. Examples of the substituent of the alkyl include halogen other than fluorine (e.g. chlorine, bromine, iodine), alkoxy having 1 to 4 carbon atoms, oxo (=O), non-substituted phenyl and phenyl substituted with a substituent such as alkyl having 1 to 4 carbon atoms, halogen, nitro or acetylamino.

The aryl represented by $R^2$ can be phenyl, naphthyl and the like, and the phenyl and naphthyl may be substituted. Examples of the substituent of the phenyl and naphthyl include alkyl having 1 to 4 carbon atoms, alkoxy having 1 to 4 carbon atoms, halogen other than fluorine (e.g. chlorine, bromine, iodine), nitro and acetylamino. As the aryl represented by $R^2$, a monocyclic one, i.e. non-substitured or substituted phenyl is preferred.

The sulfonate represented by the general formula (I) can be produced, for example, by reacting imide N-hydroxydicarboxylate produced according to the method described in G. F. Jaubert, Ber. Dtsch. Chem. 28, 360 (1985), D. E. Ames et al., J. Chem. Soc., 3518 (1955) or M. A. Stolberg et al., J. Amer. Chem. Soc., 79, 2615 (1957) with an alkyl or arylsulfonyl chloride under basic conditions according to the method described in L. Bauer. et al., J. Org. Chem. 24. 1293 (1959).

Examples of the preferred sulfonate represented by the general formula (I) include the following:

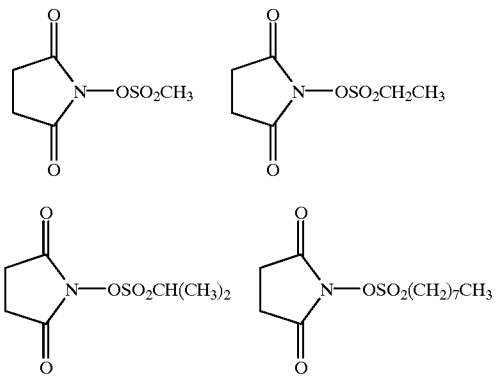

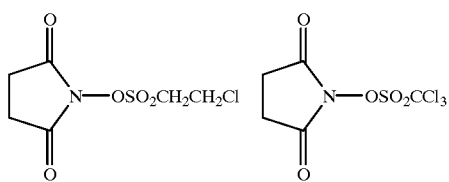
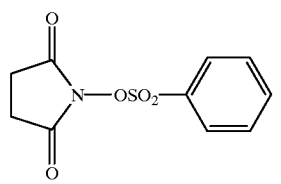
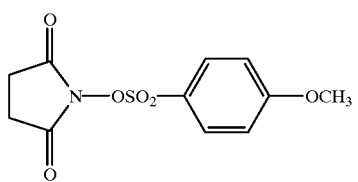
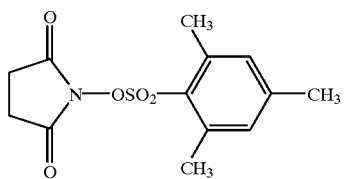
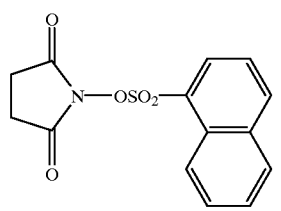
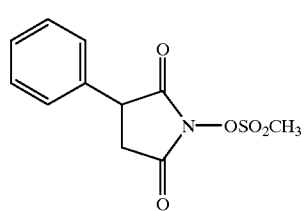
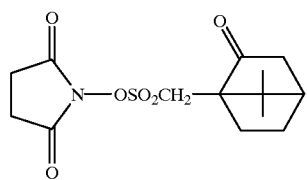
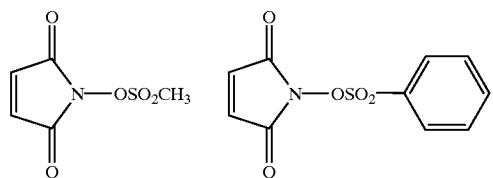

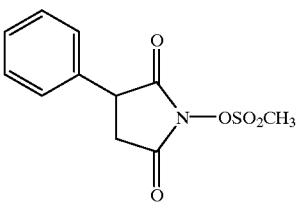
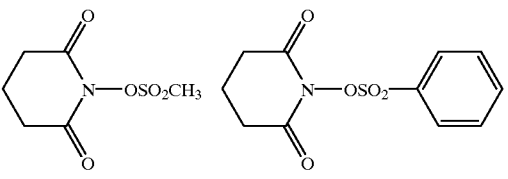
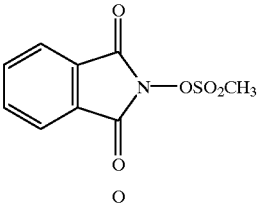
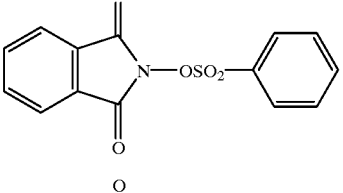
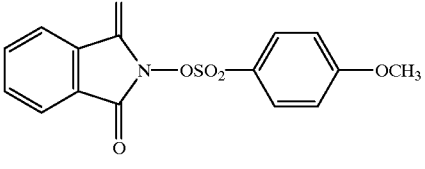
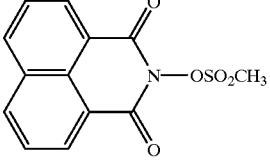
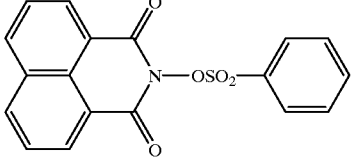

The sulfonate of the N-hydroxyimide compound as the acid generator can be used alone or a combination of two or more kinds thereof.

The photoresist composition of the present invention comprises an amine compound. The amine compound contributes to control of diffusion of the acid generated due to exposure to the resist film, thereby improving the resolution and resistance to time delay effect of the resist and reducing the PFB dependence. The term "amine compound" used herein means a compound containing a primary, secondary or tertiary amino group, preferably a compound whose total number of carbon atoms is not less than 6. When the amino group is not cyclic, the primary or secondary amine is preferred. When the amino group is cyclic, it is preferred that the nitrogen atom is tertiary. Specifically, a primary or secondary amine represented by the general formula (II):

$$R^3R^4NH \qquad (II)$$

wherein $R^3$ represents hydrogen, an optionally substituted alkyl or aryl; and $R^4$ represents an optionally substituted alkyl or aryl, or a nitrogen-containing heterocyclic aromatic compound is preferred. The resistance to time delay effect, resolution and PEB dependence are further improved by using such a primary or secondary amine or nitrogen-containing heterocyclic aromatic compound.

The alkyl represented by $R^3$ and/or $R^4$ can be an alkyl having about 1 to 20 carbon atoms, and may be substituted. The alkyl having 3 or more carbon atoms may be a straight-chain, branched or cyclic alkyl, preferably straight-chain or branched alkyl. Examples of the substituent of the alkyl include alkoxy having 1 to 4 carbon atoms, non-substituted phenyl and phenyl substituted with a substituent such as alkyl having 1 to 12 carbon atoms, alkoxy having 1 to 4 carbon atoms, amino, monoalkylamino, dialkylamino or acetylamino.

The aryl represented by $R^3$ and/or $R^4$ can be phenyl and naphthyl, and the phenyl and naphthyl may be substituted. Examples of the substituent of the phenyl and naphthyl include alkyl having 1 to 12 carbon atoms, alkoxy having 1 to 4 carbon atoms, amino, monoalkylamino, dialkylamino and acetylamino. An arylalkyl, i.e. phenylalkyl and naphthylalkyl which may be nuclear-substituted with these substituents, can be a substitutent of the phenyl and naphthyl represented by $R^3$ and/or $R^4$. In this case, the number of aryl groups substituted on the alkyl may be one or more such as triphenylmethyl. As the aryl represented by $R^3$ and/or $R^4$, a non-substituted or substituted phenyl is preferred.

Specific examples of the primary or secondary amine include monoalkylamines having 6 or more carbon atoms; dialkylamines whose total number of carbon atoms is not less than 6; anilines which may be nuclear-substituted with 1 to 3 substituents selected from the group consisting of alkyl, monoarylalkyl, diarylalkyl, triarylalkyl, alkoxy, amino, monoalkylamino, dialkylamino and acetylamino; N-alkylanilines which may be nuclear-substituted with 1 to 3 substituents selected from the group consisting of alkyl, monoarylalkyl, diarylalkyl, triarylalkyl, alkoxy, amino, monoalkylamino, dialkylamino and acetylamino; diphenylamines whose benzene nucleus may be substituted with 1 to 3 alkyl groups; and aralkylamines. As the nitrogen-containing heterocyclic aromatic compound, those wherein the nitrogen atom constituting the heterocycle is tertiary are preferred. Specific examples thereof include pyridines which may be nuclear-substituted with 1 to 3 substituents selected from the group consisting of alkyl, amino, monoalkylamino, dialkylamino and hydroxyl groups; and quinolines which may be nuclear-substituted with 1 to 3 substituents selected from the group consisting of alkyl, amino, monoalkylamino, dialkylamino and hydroxyl groups.

Examples of the particularly preferred amine compound among them include monoalkylamines having 8 to 20 carbon atoms, such as n-nonylamine and 2-ethylhexylamine; dialkylamines whose total number of carbon atoms is from 8 to 20, such as diisobutylamine and dipentylamine; nuclear-substituted anilines whose total number of carbon atoms is from 8 to 30, such as o-, m- or p-isopropylaniline, 2,6-diisopropylaniline, o-, m- or p-tert-butylaniline, o-, m- or p-sec-butylaniline, o-, m- or p-n-butylaniline, o-, m- or p-pentylaniline, o-, m- or p-hexylaniline, o-, m- or p-octylaniline, 2-, 3- or 4-triphenylmethylaniline, o-, m- or p-aminoacetoanilide, N,N-dimethyl-p-phenylenediamine, 4,4'-diamino-3,3'-dimethyldiphenylmethane, 4,4'-diamino-3,3'-diethyl-5,5'-dimethyldiphenylmethane and 1,2-bis(4-aminophenyl)ethane; diphenylamines whose total number of carbon atoms is from 12 to 20 such as diphenylamine and nuclear-alkyl substituted diphenylamine; aralkylamines whose total number of carbon atoms is from 8 to 20, such as o-, m- or p-methylbenzylamine and phenylethylamine; and tertiary nitrogen-containing heterocyclic aromatic compounds having 7 to 20 carbon atoms, such as 2-, 3- or 4-dimethylaminopyridine and 8-quinolinol.

In the present invention, it is preferred to use the amine compound in the amount within the range from 0.1 to 40% by mol, based on the acid generator.

The photoresist composition of the present invention comprises an electron donor having a redox potential of not more than 1.7 eV. Examples of the electron donor include condensed polycyclic aromatic compounds and heteropolycyclic aromatic compounds. Examples of the electron donor which is preferably used include 2-hydroxycarbazole, β-naphthol, 4-methoxynaphthol and indoleacetic acid. When using a compound having an amino group (e.g. carbazole compound, indole compound) as the electron donor, an amine compound which is not the same as the electron donor is normally used as (C) an amine compound which is another essential component of the photoresist composition of the present invention. The decomposition reaction of the acid generator caused by the electron transfer is promoted by the presence of the electron donor, thereby improving the sensitivity. Although the sensitivity of the resist is often deteriorated due to the presence of the amine compound, it is possible to compensate for the deterioration of the sensitivity due to the presence of the electron donor, which results in higher sensitivity.

The photoresist composition of the present invention can optionally contain other components. An example of and additional component is a dissolution inhibitor. Examples of the dissolution inhibitor include phenolic compounds wherein the hydrogen of the phenolic hydroxyl group is substituted with a group removable by the action of the acid, e.g. preferably tert-butoxycarbonyl and tert-butoxycarbonylmethyl. These dissolution inhibitors can be used alone or in combination of two or more kinds thereof. For example, there can be used a compound described in Japanese Patent Kokai (Laid-Open) No.5-341531 (EP-A-564,997) wherein a tert-butoxycarbonyloxy group is bonded to the benzene ring and a cyclic carbonate compound described in Japanese Patent Kokai (Laid-Open) No. 6-92909 (EP-A-569,707). Examples of the preferred dissolution inhibitor include the following.

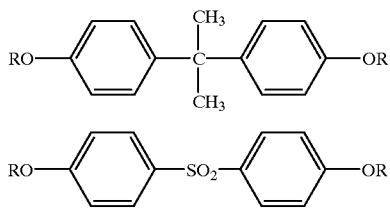

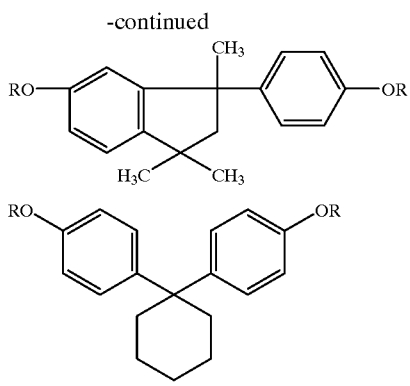

wherein R represents any one of the following groups:

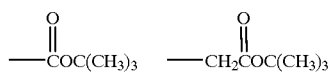

The preferred composition ratio of the positive photoresist composition of the present invention is as follows. That is, the polyvinylphenol resin and acid generator are used in an amount within the range of from 20 to 95% by weight and from 0.1 to 20% by weight, respectively, based on the weight of the total solid content in the composition. The electron donor is preferably used in an amount within the range of from 0.001 to 10% by weight, more preferably from 0.001 to 1% by weight, based on the weight of the total solid content. The amine compound is preferably used in an amount within the range of 0.001 to 10% by weight, more preferably from 0.001 to 1% by weight, based on the weight of the total solid content. When using a dissolution inhibitor, it is preferably used in an amount within the range from 5 to 50% by weight, based on the weight of the total solid content. If necessary, the positive photoresist composition of the present invention can contain various additives which are normally used in this filled, such as sensitizers, dyes and adhesive modifiers.

A resist solution is prepared by mixing the above respective components with a solvent so that the concentration of the total solid content in the positive photoresist composition is within the range from 10 to 50% by weight. It is coated on a substrate such as a silicon wafer. The solvent used may be any one which can dissolve the respective components and may be those which are normally used in this field. Examples thereof include glycol ether esters such as ethylcellosolve acetate, methylcellosolve acetate, propylene glycol monomethyl ether acetate and propylene glycol monoethyl ether acetate; glycol mono- or diethers such as ethylcellosolve, methylcellosolve, propylene glycol monomethyl ether, propylene glycol monoethyl ether and diethylene glycol dimethyl ether; esters such as ethyl lactate, butyl acetate and ethyl pyruvate; ketones such as 2-heptanone, cyclohexanone and methyl isobutyl ketone; and aromatic hydrocarbons such as xylene. These solvents can be used alone or in combination of two or more kinds thereof.

The positive photoresist composition of the present invention has a feature that it shows excellent resolution and good profile in the region exposed to far ultraviolet light (including excimer laser, etc.), electron ray, X-ray or radiation and its performances are not easily influenced by the standing time from exposure to PEB. Furthermore, the positive photoresist composition has small PEB dependence and is also superior in sensitivity, film retention and coatability. Accordingly, in lithography using the above light source, the resolution and contrast can be remarkably improved and a fine photoresist pattern can be formed with high accuracy.

The following Examples further illustrate the present invention in detail but should not be construed to limit the scope thereof. In the Examples, "parts" and "% s'" are by weight unless otherwise stated.

REFERENCE EXAMPLE 1

(Introduction of protective group into polyvinylphenol)

Poly(p-vinylphenol) ["VP-5000" manufactured by Nihon Soda Co., Ltd., weight-average molecular weight: 12,800, weight-average molecular weight/number-average molecular weight: 1.28] (30.0 g) was dissolved in 300 ml of acetone. Thereto, potassium carbonate (8.28 g), potassium iodide (1.658 g) and tert-butyl chloroacetate (7.52 g) were added, and then the mixture was refluxed for 8 hours. After an insoluble matter (potassium carbonate) was removed from the reaction solution by filtration, the filtrate was dissolved in 1 liter of methyl isobutyl ketone and the solution was washed three times with 500 ml of deionized water. Then the solvent was distilled off under reduced pressure to obtain poly(p-vinylphenol) wherein 20% of the hydroxyl groups were tert-butoxycarbonylmethyl-etherified.

REFERENCE 2

(the same as the above)

The same operation as that of Reference Example 1 was conducted except for changing the amount of potassium carbonate, potassium iodide and tert-butyl chloroacetate to 12.42 g, 2.487 g and 11.281 g, respectively, to obtain poly(p-vinylphenol) wherein 30% of the hydroxyl groups were tert-butoxycarbonylmethyl-etherified.

REFERENCE 3

(the same as the above)

The same operation as that of Reference Example 1 was conducted except for changing the amount of potassium carbonate, potassium iodide and tert-butyl chloroacetate to 13.67 g, 2.736 g and 12.41 g, respectively, and changing the reflux time to 10 hours to obtain poly(p-vinylphenol) wherein 33% of the hydroxyl groups were tert-butyoxycarbonylmethyl-etherified.

EXAMPLE 1

The resin synthesized in Reference Example 1 (13.5 parts), 10-camphorsulfonate of N-hydroxysuccinimide having a structure of the following formula:

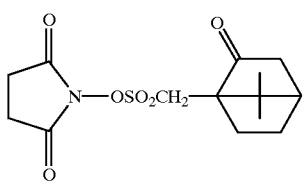

(1.0 part) as an acid generator, 2-hydroxycarbazole (0.135 parts) and 2,6-diisopropylaniline in an amount of 8% by mol based on the acid generator were dissolved in a mixed solvent (65 parts) of propylene glycol monomethyl ether acetate and ethyl lactate in the ratio of 8:2. The resulting solution was filtered through a fluororesin filter having a pore diameter of 0.1 μm to prepare a resist solution.

The above resist solution was coated on a silicon wafer, which was washed according to a conventional method, using a spin coater, so that the film thickness after drying becomes 0.7 μm. Then, this silicon wafer was prebaked on a hot plate at 100° C. for 90 seconds. The film after prebaking was exposed through a chrome mask having a pattern using a KrF excimer laser stepper having an exposure wavelength of 248 nm ["NSR-1755 EX8A" manufactured by Nikkon Co., Ltd., NA: 0.45] while changing the exposure dose stepwise. After completion of the exposure, the wafer was heated on the hot plate at 100° C. for 90 seconds (PEB) to conduct a deblocking reaction of the exposed part. The resultant was developed with an aqueous 2.38 wt % solution of tetramethylammonium hydroxide to obtain a positive pattern.

The formed pattern was observed using an electron microscope to determine the exposure dose at which a cross section of a 0.3 9 μmline/space pattern becomes 1:1 (effective sensitivity). It was 70 mJ/cm². The width of a minimum line/space which separates at the exposure dose of the effective sensitivity without causing film thickness reduction (resolution) was 0.23 μm. A profile (form of pattern) was good. Even if the exposed wafer was allowed to stand for 10 minutes from the exposure to PEB, a change in resolution and profile was not observed at all.

EXAMPLES 2 to 6

The same operation as in Example 1 was conducted except for using the same molar amount of amine compounds described in Table 1 in place of 2,6-diisopropylaniline. The results are shown in Table 1.

<TABLE 1>

| Example No. | Amine compound | Effective sensitivity | Resolution |
|---|---|---|---|
| 2 | p-tert-Butylaniline | 110 mJ/cm² | 0.24 μm |
| 3 | o-Isopropylaniline | 93 cmJ/cm² | 0.22 μm |
| 4 | p-Octylaniline | 142 mJ/cm² | 0.22 μm |
| 5 | 4,4'-Diamino-3,3'-dimethyldiphenylmethane | 178 mJ/cm² | 0.25 μm |
| 6 | 1,2-Bis(4-aminophenyl)ethane | 136 mJ/cm² | 0.24 μm |

COMPARATIVE EXAMPLE 1

According to the same manner as in Example 1 except for using no 2-hydroxycarbazole, a resist solution was prepared. Using this resist solution, a film was formed under the same condition as in Example 1, and then exposed. A pattern was not formed at the exposure dose of 200 mJ/cm² (248 nm).

EXAMPLE 7

The resin synthesized in Reference Example 2 (13.5 parts), 10-comphorsulfonate of N-hydroxysuccinimide (1.0 part) as the acid generator, 2-hydroxycarbazole (0.27 parts) and 8-quinolinol (0.08 parts) were dissolved in a mixed solvent 65 parts) of propylene glycol monomethyl ether acetate and lactate in the ratio of 8:2, and, then, according to the same manner as in Example 1, a resist solution was prepared. Using this resist solution, the same operation in Example 1 was conducted, and the formed pattern was observed using an electron microscope. The effective sensitivity was 168 mJ/cm² and the resolution was 0.22 μm. The profile was also good. Even if the exposed wafer was allowed to stand for 10 minutes from the exposure to PEB, a change in resolution and profile was not observed at all.

EXAMPLES 8 TO 11

The same operation as in Example 7 was conducted except for using the same molar amount of amine compounds described in Table 2 in place of 8-quinolinol. The results are shown in Table 2.

<TABLE 2>

| Example No. | Amine compound | Effective sensitivity | Resolution |
|---|---|---|---|
| 8 | n-Nonylamine | 154 mJ/cm² | 0.24 μm |
| 9 | 2-Phenylethylamine | 162 mJ/cm² | 0.24 μm |
| 10 | 2-Ethylhexylamine | 140 mJ/cm² | 0.24 μm |
| 11 | p-Isopropylaniline | 128 mJ/cm² | 0.23 μm |

COMPARATIVE EXAMPLE 2

The same operation as in Example 7 was conducted except for using 0.08 parts of N-methyl-2-pyrrolidone in place of 8-quinolinol. The formed pattern was observed using an electron microscope. The effective sensitivity was 68 mJ/cm² and the resolution was 0.28 μm. However, when the exposed wafer was allowed to stand for 10 minutes from the exposure to PEB, a surface insolubilized layer was formed and it became impossible to resolve a pattern of 0.30 μm.

EXAMPLE 12

The resin synthesized in Reference Example 3 (13.5 parts), 10-camphorsulfonate of N-hydroxysuccinimide (1.0 part) as the acid generator, 2-hydroxycarbazole (0.27 parts) and p-n-butylaniline in an amount of 10% by mole based on the acid generator were dissolved in the mixed solvent (65 parts) of propylene glycol monomethyl ether acetate and ethyl lactate in the ratio of 8:2, and, then, according to the same manner as in Example 1, a resist solution was prepared. Using this resist solution, the same operation as in Example 1 was conducted, and the formed pattern was observed using an electron microscope. The effective sensitivity was 160 mJ/cm² and the resolution was 0.23 μm. The profile was also good. Even if the exposed wafer was allowed to stand for 10 minutes from the exposure to PEB, a change in resolution and profile was not observed at all.

EXAMPLES 13 TO 20

The same operation as in Example 12 was conducted except for using the same molar amount of amine compounds described in Table 3 in place of p-n-butylaniline. The results are in Table 3.

<TABLE 3>

| Example No. | Amine compound | Effective sensitivity | Resolution |
|---|---|---|---|
| 13 | p-sec-Butylaniline | 136 mJ/cm² | 0.23 μm |
| 14 | p-tert-Butylaniline | 150 mJ/cm² | 0.23 μm |
| 15 | 4-Triphenylmethylaniline | 184 mJ/cm² | 0.25 μm |
| 16 | o-Isopropylaniline | 100 mJ/cm² | 0.23 μm |
| 17 | p-Octylaniline | 145 mJ/cm² | 0.23 μm |

<TABLE 3>-continued

| Example No. | Amine compound | Effective sensitivity | Resolution |
|---|---|---|---|
| 18 | N,N-dimethyl-p-phenylenediamine | 210 mJ/cm² | 0.25 µm |
| 19 | p-Aminoacetoanilide | 183 mJ/cm² | 0.25 µm |
| 20 | 4,4'-Diamino-3,3'-diethyl-5,5'-dimethyldiphenylmethane | 196 mJ/cm² | 0.23 µm |

What is claimed is:

1. A positive photoresist composition comprising:
   (A) a polyvinylphenol resin whose phenolic hydroxyl group is partially protected;
   (B) a sulfonate of a N-hydroxyimide compound;
   (C) an amine compound; and
   (D) an electron donor having a redox potential of not more than 1.7 eV.

2. The composition according to claim 1, wherein the phenolic hydroxyl group of the polyvinylphenol resin is partially protected with a tert-butoxycarbonylmethyl group.

3. The composition according to claim 1 or 2, wherein the sulfonate of the N-hydroxyimide compound is represented by the general formula (I):

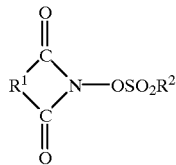

(I)

wherein R¹ represents an arylene, an optionally substituted alkylene or an optionally substituted alkenylene; and R² represents an alkyl which may be substituted with a substituent other than fluorine, or an aryl containing no fluorine.

4. The composition according to claim 1, wherein the amine compound is a primary or secondary amine.

5. The composition according to claim 1, wherein the amine compound is a nitrogen-containing heterocyclic aromatic compound.

6. The composition according to claim 1, wherein (A) the amount of the polyvinylphenol resin, (B) the sulfonate and (D) the electron donor are 20 to 96% by weight 0.1 to 20% by weight and 0.001 to 10% by weight; respectively, based on the weight of the total solid content in the composition.

7. The composition according to claim 1, comprising the amine compound (C) in an amount of 0.1 to 40% by mol, based on the acid generator.

8. The composition according to claim 1, comprising the amine compound (C) in an amount of 0.001 to 10% by weight, based on the weight of the total solid content in the composition.

9. The composition according to claim 1, further comprising a phenolic compound wherein hydrogen of a phenolic hydroxyl group is substituted with a group which can be eliminated by an action of an acid.

10. The composition according to claim 9, comprising a dissolution inhibitor in an amount of 5 to 50% by weight, based on the weight of the total solid content in the composition.

* * * * *